(12) United States Patent
Mostafazadeh

(10) Patent No.: US 7,067,927 B1
(45) Date of Patent: Jun. 27, 2006

(54) DIE WITH INTEGRAL PEDESTAL HAVING INSULATED WALLS

(75) Inventor: Shahram Mostafazadeh, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 11/048,182

(22) Filed: Jan. 31, 2005

(51) Int. Cl.
*H01L 23/48* (2006.01)
*H01L 23/52* (2006.01)
*H01L 29/40* (2006.01)

(52) U.S. Cl. .................. 257/777; 257/685; 257/723; 257/E23.085; 257/E25.005; 257/E25.006; 257/E23.021; 257/E23.023; 438/109

(58) Field of Classification Search .......... 257/777, 257/723, 685, 686, E25.005, E25.006, E25.021, 257/E25.023, E25.085; 438/109, FOR 368, 438/FOR 436
See application file for complete search history.

(56) References Cited

U.S. PATENT DOCUMENTS

| | | | |
|---|---|---|---|
| 6,023,094 A | 2/2000 | Kao et al. | |
| 6,075,290 A | 6/2000 | Schaefer et al. | |
| 6,175,162 B1 | 1/2001 | Kao et al. | |
| 6,548,323 B1 | 4/2003 | Perry et al. | |
| 6,777,797 B1* | 8/2004 | Egawa | 257/686 |
| 6,911,723 B1* | 6/2005 | Akram | 257/686 |
| 2004/0245652 A1* | 12/2004 | Ogata | 257/777 |

OTHER PUBLICATIONS

U.S. Appl. No. 10/969,729, filed Oct. 19, 2004.

* cited by examiner

*Primary Examiner*—Jasmine Clark
(74) *Attorney, Agent, or Firm*—Beyer Weaver & Thomas, LLP (57) ABSTRACT

A variety of techniques and structures are described that integrate an insulated pedestal into the back surface of integrated circuit dice. The die has an insulated integral pedestal formed therein that acts as a spacer. The pedestal has a footprint that is smaller than the total footprint of the die so that a portion of the active region of the die overhangs the pedestal. The geometry of the pedestal may be widely varied and in some embodiments, multiple pedestals may be provided on the stacked die. In another aspect, the pedestals are formed at the wafer level such that the pedestals are defined in the back surface of the wafer. Often, the thickness of the pedestals will be thicker than the portions of the wafer outside the pedestal areas. The described dice are particularly well suited for use in stacked die packages.

22 Claims, 5 Drawing Sheets

DIE WITH INTEGRAL PEDESTAL HAVING INSULATED WALLS

CROSS REFERENCE TO RELATED APPLICATIONS

The present invention is related to co-pending application Ser. No. 10/969,729 filed Oct. 19, 2004, which is incorporated herein by reference.

BACKGROUND OF THE INVENTION

The present invention relates generally to the packaging of integrated circuits. More particularly, the invention relates to dice having integrated pedestals.

There are a number of conventional processes for packaging integrated circuits. In many situations it is desirable to incorporate multiple integrated circuit dice into the same package in what is commonly referred to as a multi-chip package. Some multi-chip packages are arranged to stack two or more dice on top of each other. These stacked die packages have several potential advantages including the possibility of a reduced die or package footprint and certain performance advantages. For example, reducing the path length of electrical connections between integrated circuits potentially increases speed and reduces inductance of inter-chip communications.

Figure 1:
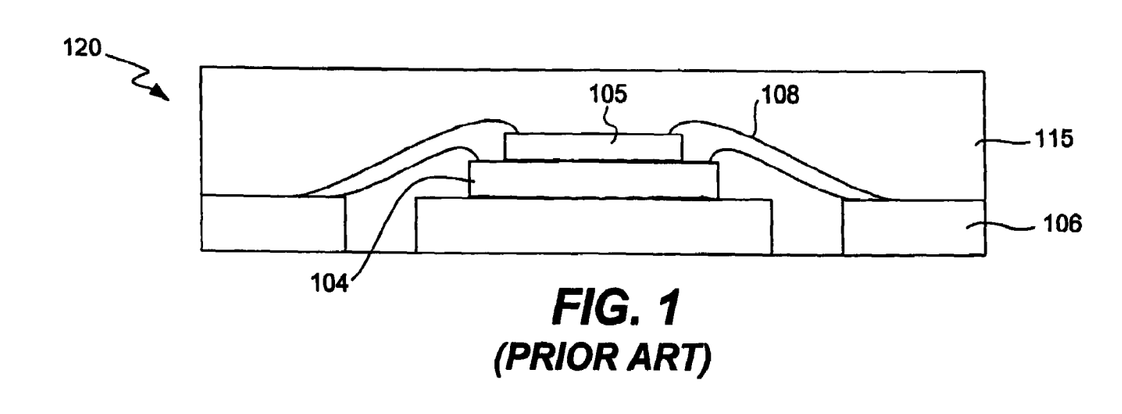
FIG. 1 is a diagrammatic cross sectional view of a stacked die package having a top die mounted directly on a base die.

One existing stacked die configuration is generally illustrated in FIG. 1. In this configuration a first die 104 is mounted on a carrier such as a lead frame 106 or a planar substrate. A second die 105 is then adhesively secured to the top surface of the first die 104 thereby creating a stacked die configuration. Bonding wires 108 are used to electrically connect both of the dice 104, 105 to the carrier (lead frame 106) using conventional wire bonding. An encapsulant material 115 is molded over the stacked dice to create a stacked die package 120. This stacked die approach allows the top die 105 to be electrically connected to both the underlying base die 104 and to a substrate or lead frame 106. This arrangement also generally requires that the top die 105 must be smaller than the base die 104 so that the top die 105 does not cover any of the bond pads on the base die 104.

Figure 2:
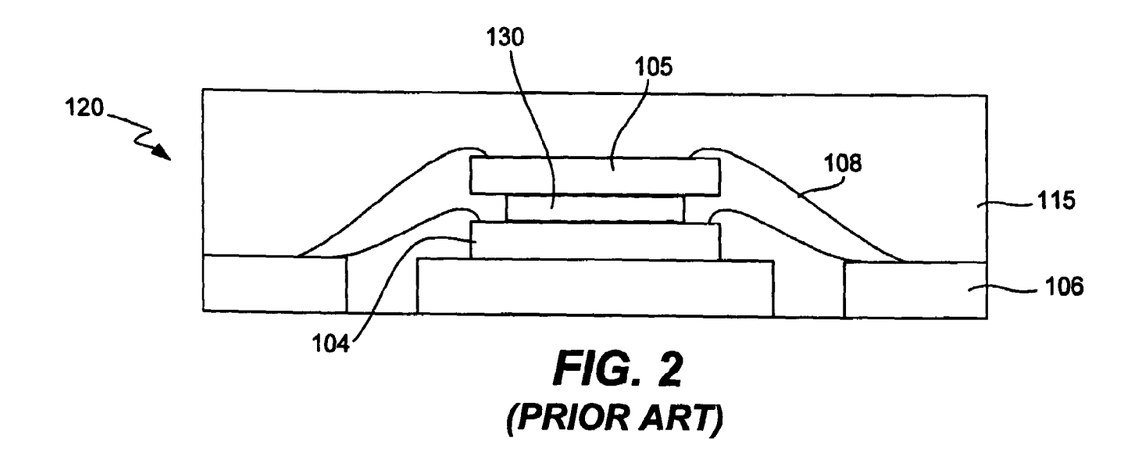
FIG. 2 is a diagrammatic cross sectional view of a stacked die package having a spacer that separates the top die and the base die.

Another stacked die approach is generally illustrated in FIG. 2. In this approach, a spacer 130 is adhesively secured to (or dispensed onto) the top surface of the bottom die 104. The top die 105 is then adhesively adhered to the spacer 130. The spacer 130 is sized so that it extends higher than the loop height of the bonding wires 108 used to electrically connect the base die, thereby providing clearance for the bonding wires. The spacer 130 can be formed from virtually any material that is compatible with the dice. By way of example, the spacer may be formed from a variety of materials such as silicon, various ceramics, etc. Alternatively, the spacer may be formed in situ by dispensing an adhesive material having ball like spherical support structures therein on the top surface of the lower die 104 in a region that is interior to the bond pads. The spacer 130 effectively forms a plateau on the bottom die that provides structural support for the top die. With this arrangement, the top die 105 can be virtually any size including the same size or even larger than the base die.

Although the foregoing techniques work well in many applications, in the semiconductor industry, there are continuing efforts to provide more efficient packaging approaches. The packaging arrangements described below are particularly useful in forming stacked multi-chip packages.

SUMMARY OF THE INVENTION

To achieve the foregoing and other objects of the invention, a variety of techniques and structures are described that integrate an insulated pedestal into the back surface of an integrated circuit die. In a first aspect, a semiconductor die is provided that has an integral pedestal formed therein. An electrical insulator material covers at least portions of the sidewalls of the pedestal. In many implementations, the insulator material also covers the back surface of ledges that overhang the pedestal. In some embodiments, the thickness of the pedestal is more than half of the thickness of the entire die.

In another aspect, an integrated circuit package is described that includes a base die and a second die that is stacked on the base die. The second die has an integral pedestal formed therein that acts as a spacer. An electrical insulator material covers at least portions of the sidewalls of the pedestal. The electrical insulator material helps prevent bonding wires or other connectors coupled to the base die from electrically communicating with the pedestal. The pedestal has a footprint that is smaller than the total footprint of the second die so that a portion of the active region of the die overhangs the pedestal. The pedestal spacer is sized so that it is higher than the loop height of bonding wires used to electrically connect the base die to a carrier (e.g., a leadframe, a substrate, etc.). The geometry of the pedestal may be widely varied and in some embodiments, multiple pedestals may be provided on the stacked die. In some implementations, a ledge is arranged to extend entirely around the pedestal such that it overhangs portions of the bonding wires that electrically connect the base die to a carrier.

In a wafer aspect of the invention, an integrated circuit wafer is provided that has an active region patterned to define a multiplicity of dice. The wafer also includes a multiplicity of pedestals that are integrally formed with the active region of the wafer and protrude from the back surface of the wafer. Each pedestal has sidewalls that are coated with an electrically insulating layer. In many embodiments, each die has one or more associated pedestals. Often, the thickness of the pedestals will be thicker than the portions of the wafer outside the pedestal areas.

In a method aspect of the invention a wafer level method of forming dice suitable for use in stacked packages is described. A wafer is initially fabricated or background to a desired thickness. The back surface of the wafer is then cut to define spacer pedestals in the bulk semiconductor region of the wafer. The pedestals may be formed using any suitable material removal technique, as for example, etching, grinding or laser cutting. After the pedestals have been formed, an insulating material is deposited on at least sidewall portions of the pedestal. In many implementations, the insulating material also covers the back surfaces of ledges that overhang the pedestals. After the insulating layer has been formed, the wafer may be diced. In some embodiments, each singulated die has an associated spacer pedestal.

In a packaging aspect of the invention, a base die is positioned relative to a carrier (e.g. a substrate, a leadframe, etc.) and electrically connected to the carrier. A second die having an integrally formed spacer pedestal is then adhered to the active surface of the base die in a region that does not have any bonding wires thereon. The second die is positioned such that a ledge portion of the die at least partially overhangs at least some of the bonding wires.

BRIEF DESCRIPTION OF THE DRAWINGS

The invention, together with further objects and advantages thereof, may best be understood by reference to the following description taken in conjunction with the accompanying drawings in which.

It is to be understood that, in the drawings, like reference numerals designate like structural elements. Also, it is understood that the depictions in the figures are diagrammatic and not to scale.

DETAILED DESCRIPTION OF THE PREFERRED EMBODIMENTS

Figure 3:
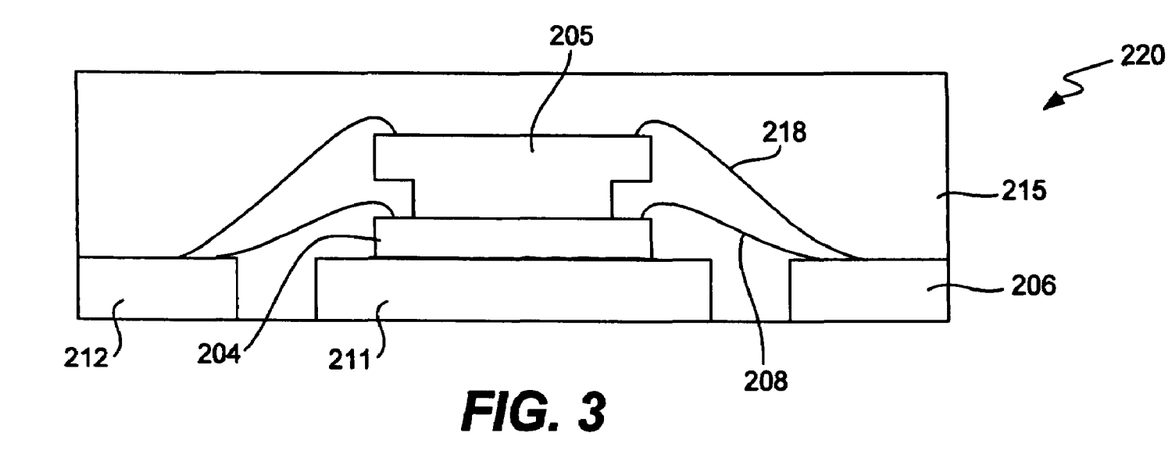
FIG. 3 is a diagrammatic cross sectional view of a stacked die package in accordance with one embodiment of the present invention.

The present invention generally contemplates the formation of dice having integral spacer pedestals formed therein that have insulated sidewalls. Such dice are particularly well suited for use in stacked die packages. Referring initially to FIG. 3, a stacked die package 220 in accordance with one embodiment of the present invention will be described. In the illustrated embodiment, a base die 204 is mounted on a carrier 206, which in the illustrated embodiment is a lead frame. The lead frame has a die attach pad 211 and a plurality of contacts 212. In other embodiments, the carrier may be any other type of lead frame, a substrate (which may, for example be formed from BT, FR4 or any other appropriate substrate material), or any other suitable interconnect structure. The base die 204 has a multiplicity of I/O pads that are generally located around the periphery of the active (top) surface of the die (the I/O pads are commonly referred to as bond pads when the die is to be electrically connected using wire bonding). A stacked die 205 is adhesively secured to a central region of the base die 204 that is surrounded by the bond pads.

Figure 6:
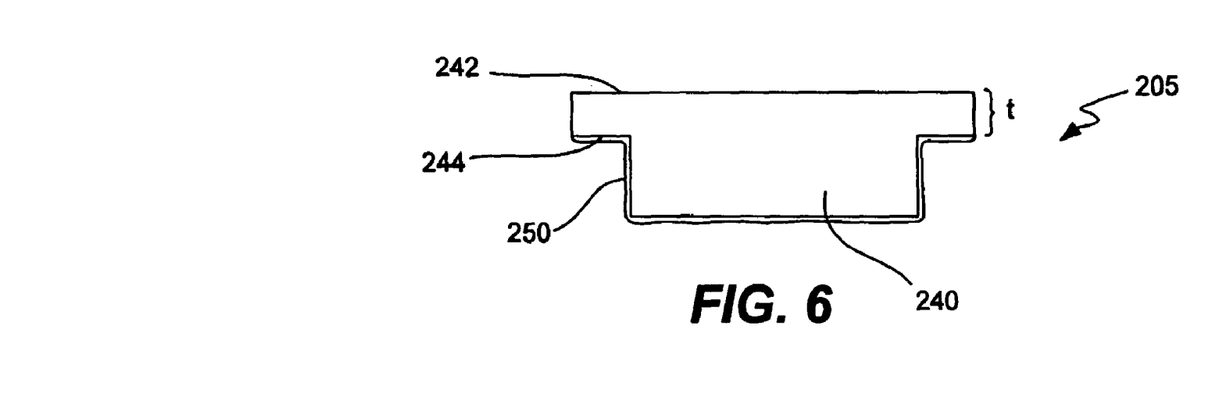
FIG. 6 is a diagrammatic cross sectional view of an individual die having an insulated integral spacer pedestal.

As best illustrated in FIG. 6, the stacked die 205 has an integrally formed pedestal 240 that has a smaller footprint than the top (active) surface 242 of the die. Thus, the active region of the die effectively includes a ledge 244 that is formed around the pedestal 240. The height of the pedestal 240 is preferably sized so that when the stacked die 205 is placed on the base die 204 as illustrated in FIG. 3, the ledge 244 overhangs at least some of the bonding wires 208 used to electrically connect the base die 204 to the leadframe 206 with a bit of clearance. The size and footprint geometry of the pedestal is preferably selected so that the pedestal will not overlie any of the bond pads on the base die that are expected to be used.

In the embodiment illustrated in FIG. 3, an encapsulant 215 is used to encapsulate the dice 204, 205 and the bonding wires 208, 218. However, in other embodiments, other package structures including metal packages, ceramic packages and the like may be used. The resultant packages may be lead frame based or substrate based (such as a BGA package). The encapsulant 215 can be applied using any suitable process including molding, dispensing, etc.

A problem that can sometimes occur when applying an encapsulant is referred to as "wire sweep." Most commonly wire sweep occurs when molding using plastic encapsulants. Specifically, the encapsulant material has some viscosity and since the bonding wires are very fine, the encapsulant tends to push against the bonding wires as it flows into place. These forces can cause the bonding wires to move somewhat in some instances. This movement of the wires during the encapsulation process is commonly referred to as wire sweep.

Figure 8:
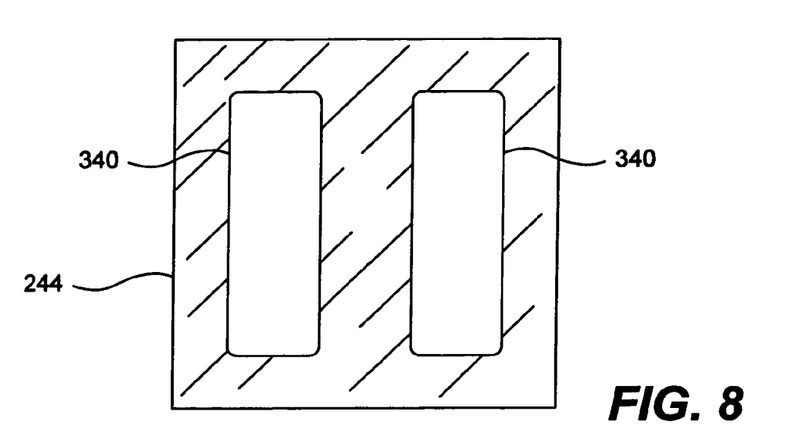
FIG. 8 is a diagrammatic bottom view of an individual die having a pair of insulated spacer pedestals.
Figure 9:
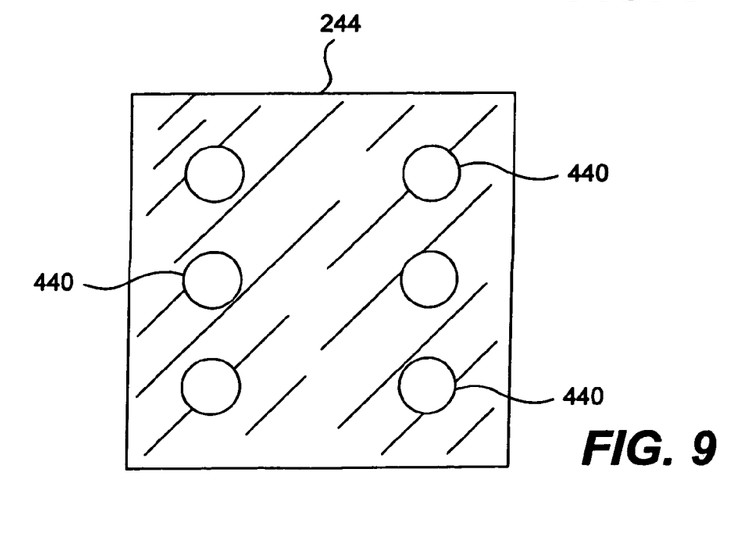
FIG. 9 is a diagrammatic bottom view of an individual die having an array of insulated spacer posts.

In some cases, if the tolerances between the pedestal and the bonding wires are rather small, there is a risk that the bonding wires can inadvertently come into contact with the pedestal. This can be problematic because the bulk silicon that forms the pedestal is a semiconductor material and therefore can cause shorting of the bonding wires and/or otherwise electrically interfere with the electrical performance of the die. Therefore, in the illustrated embodiment, an insulating layer 250 is applied to the pedestal and the bottom surface of the ledges 244. In some embodiments, the insulating layer 250 will cover the back surface of the pedestal as shown if FIGS. 6 and 7. However, in alternative embodiments, as illustrated in FIGS. 8 and 9, the back surface of the pedestal(s) may remain uninsulated. With the insulating layer 250 in place, the risk of the pedestal (or the bottom surface of the die) electrically interfering with the bonding wires (or vice versa) is significantly reduced. More specifically, even if the bonding wires inadvertently contact the pedestal or the bottom surface of the die, the insulating layer 250 will prevent electrical communication between the bonding wire and the adjacent semiconductor material.

Although the usefulness of the insulating material has been described primarily in the context of a stacked package having a plastic encapsulant that may cause wire sweep, it should be appreciated that the described dice have many other uses as well. For example, they may be used in stacked die packages such as metal or ceramic packages that do not utilize a plastic encapsulant. It should be appreciated that movement of the wires can be an even larger concern in these types of packages. Additionally, dice having the described pedestals may have a variety of other uses and the insulation of the sidewalls of the pedestal, the back surface of the ledge regions of the die and/or the back surface of the pedestal may be useful in these situations as well. For example, in applications where the back surface of the die may be exposed to light, an optically opaque insulating layer may also help reduce the risk of light interfering with the performance of the die.

Figure 7:
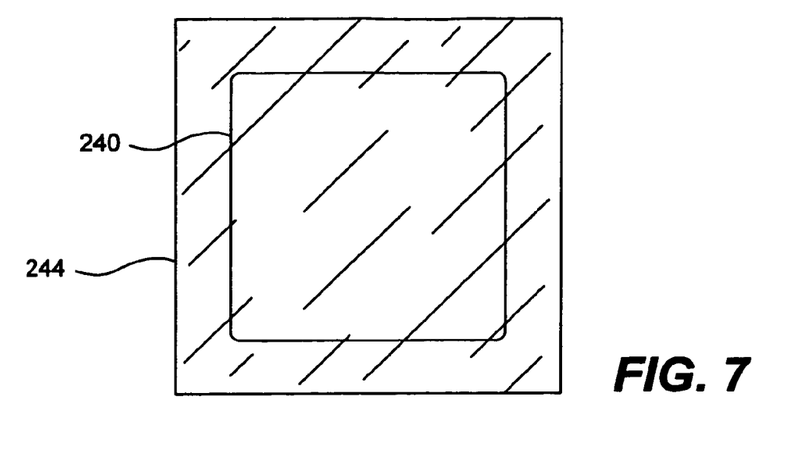
FIG. 7 is a diagrammatic bottom view of the die illustrated in FIG. 6.

In the embodiment illustrated in FIGS. 3, 6 and 7, a single, centrally located, substantially rectangular pedestal is provided. With this configuration, the ledge 244 extends all of the way around the pedestal. However, the configuration of the pedestal may be widely varied to meet the needs of any particular application. In the illustrated embodiment, the corners of the pedestal are rounded, however that is not a requirement. The corners can be sharp, tapered, significantly rounded or any other appropriate geometry. The footprint of the pedestal may also be widely varied. For example, the footprint may be substantially circular, oval, trapezoidal, triangular, L-shaped or any other appropriate geometry including a variety of odd shapes.

In the embodiment illustrated in FIGS. 6 & 7, the pedestal is centrally located on the die. However, in other embodiments, the pedestal may be located off center or even along one or more of the sides of the die. It should be appreciated that if the pedestal is located along a side of the die, then the ledge may overhang only some of the edges of the pedestal.

In some embodiments it may be desirable to provide more than one pedestal on the die. For example, in the embodiment illustrated in FIG. 8, a pair of substantially rectangular pedestals 340 are provided. The pedestals 340 illustrated in FIG. 8 extend in parallel and are of substantially the same size. In other embodiments, additional pedestals may be provided. The various pedestals may be of the same shape or different shapes, the same size or different sizes. The pedestals may be arranged in parallel rows or interspersed at different locations on the backside of the die. One other example is illustrated in FIG. 9 which shows a configuration in which the pedestals take the form of a two dimensional array of spaced apart posts 440. In other embodiments, the pedestals may be configured as a parallel series of elongated narrow pedestal strips.

In many situations, the desired size and location of the pedestal(s) will be influenced in large part by the topology of the top surface of the base die. Generally, the pedestal spacer must be positioned on a region of the top surface of the base die that does not have any exposed I/O pads. As will be appreciated by those familiar with the packaging arts, some dice have bond pads located near the middle of the active surface. For example, centrally located, elongated bus bar style bond pads are frequently used in various power devices. Stacking is particularly problematic in these types of devices because there may be little room to adhere a conventional spacer. With the pedestal arrangement illustrated in FIG. 8, the pedestals can be configured to straddle one or more centrally located bond pads and provide a gap that accommodates bonding wires. Electrical insulation of the pedestal can be particularly useful in these embodiments. Similarly, the pedestal arrangement illustrated in FIG. 9 can be arranged to straddle a number of separate bond pads. Of course the layout and geometry of the pedestals can be widely varied to accommodate the design of the underlying base die.

It should be appreciated that the use of an integrally formed pedestal on the stacked die as the spacer that provides clearance for the bonding wires on the bottom die eliminates the processing steps needed to mount or form a distinct spacer on each base die.

Figure 4:
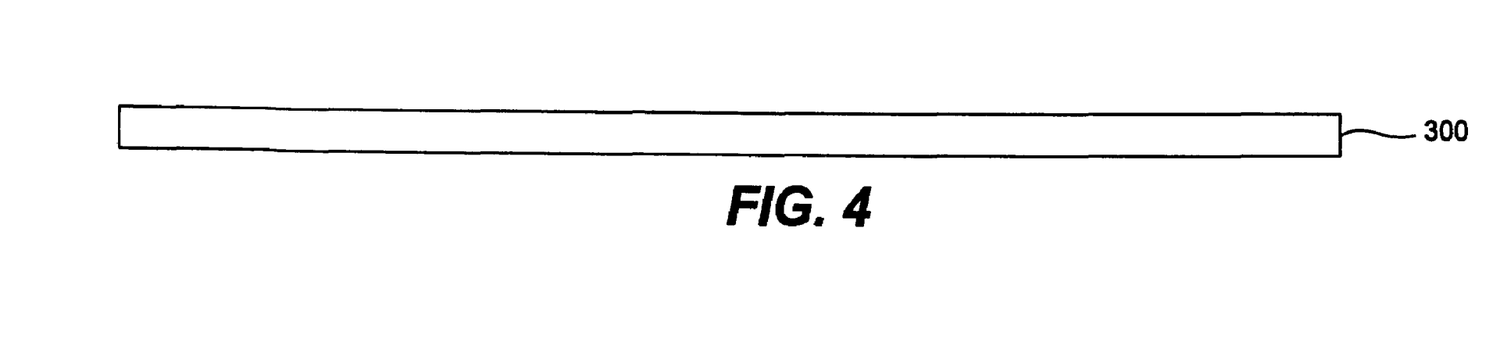
FIG. 4 is a diagrammatic cross sectional view of a semiconductor wafer.
Figure 5A:
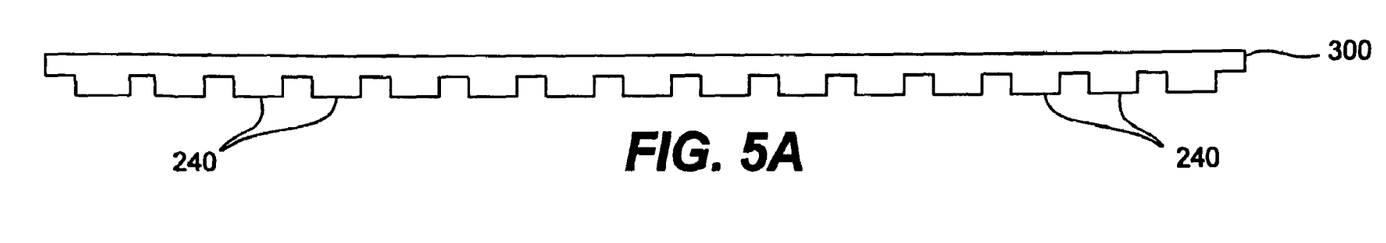
FIG. 5(a) is a diagrammatic cross sectional view of the semiconductor wafer shown in FIG. 4 after the wafer has been processed in accordance with an embodiment of the invention to form spacer pedestals.
Figure 5B:
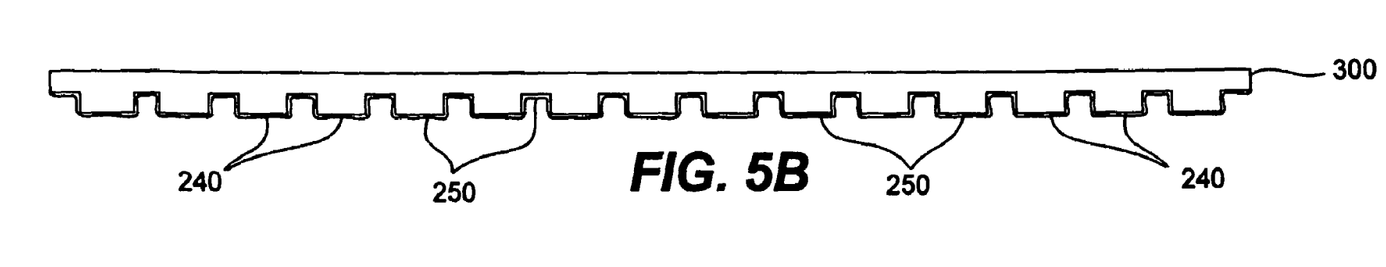
FIG. 5(b) is a diagrammatic cross sectional view of the wafer illustrated in FIG. 5(a) after application of an insulating layer.

Referring next to FIGS. 4–6, a method suitable for forming the integral pedestal will be described. As will be appreciated by those familiar with the art, semiconductor wafers are typically relatively thick when they are initially fabricated. For example, a typically thickness for an eight inch diameter wafer might be on the order of 32 mils during fabrication. Larger diameter wafers are typically even thicker during fabrication. However, for many state of the art packages, including most stacked die packages, a 32 mil thick die is unacceptable. Accordingly, it is generally desirable to reduce the thickness of the dice significantly. This is done by removing excess material on the back surface of the wafer in an operation typically referred to as "backgrinding" the wafer. Today, most backgrinding operations are performed using a mechanical grinding operation, although other suitable techniques such as polishing, etching, laser ablation, etc. may be used.

The final thicknesses of the wafers (and thus the resulting dice) may be widely varied. However, by way of example, 2 to 3 mil thick dice are currently commonly used in thin stacked die applications and it is expected that even thinner dice (and thus wafers) will become more common in the future. This can readily be accommodated in most applications because the active circuitry and other components in the wafer are generally formed only in the very top portion of the wafer, e.g., all within the top fraction of a mil of the wafer.

In stacked die applications, the required height of the spacers will vary depending in large part on the desired loop height of the bonding wires. By way of example, typical spacer heights on the order of 6 to 10 mils are common. Thus, it should be apparent that the required spacer height is typically much less than the thickness of the wafer that is removed during backgrinding.

To fabricate a pedestal, the wafer 300 may initially be background to a thickness that is equal to the desired top die thickness, plus the desired spacer thickness. By way of example, if the desired die thickness is 3 mils and the desired spacer thickness is 8 mils, the wafer would be background to a thickness of 11 mils using any conventional or appropriate backgrinding technique. A representative background wafer 300 is illustrated in FIG. 4. After backgrinding, the back surface of the wafer is selectively cut to define the pedestals. The pedestal 240 may be formed by any of a variety of standard semiconductor material removal techniques. By way of example, a controlled masked etch may be used to etch regions of the background wafer 300 that are not intended to be part of the pedestals 240. The height of the pedestals, and thus the thickness (t) of the resulting dice will be defined by the depth of the etch. The deeper the etch on a wafer of a given thickness, the higher the pedestal and the thinner the wafer. Of course, other material removing techniques such as grinding, laser cutting etc. can be used instead of or in addition to etching.

A representative etched wafer is diagrammatically illustrated in FIG. 5(*a*). The etching is arranged to define the desired geometry of the pedestals and to thin the portions of the wafer that are not part of the pedestals to the desired die thickness (e.g., 3 mils in the example). The thinned portions of the wafer form the overhanging ledges 244 on the dice. After the pedestals have been formed, an insulating layer is applied to the backside of the wafer as illustrated in FIG. 5(*b*). In some applications, the insulating layer will be applied to the entire back surface of the wafer so that it covers the back surface of the pedestals as well as the trenches. Alternatively, the insulating layer may be applied (or retained) only in the trenches so that it only covers the sidewalls of the pedestal and the back surface of the ledges.

A variety of approaches may be used to apply the insulating layer. By way of example, spin coating and spraying would both work well. Of course, other insulating layer depositing techniques including screen printing, vapor deposition, dispensing, etc. can be used as well. The material that is used to form the insulating layer may be widely varied as well. By way of example, polyimide and benzocyclobutene (BCB) work well. Either of these materials are well suited for use in both spin coating and spraying application.

In an alternative approach, the insulating layer may be formed using standard deposition techniques. By way of example, a silicon dioxide insulating layer may be formed in a vapor deposition chamber. Of course other conventional semiconductor insulating materials such as silicon nitride may be used as well.

After the insulating material has been applied, any other desired wafer level processing may be performed and then the wafer may be diced to form a multiplicity of individual dice (each having an associated pedestal), that are well suited for use in stacked die packages.

Figure 10:
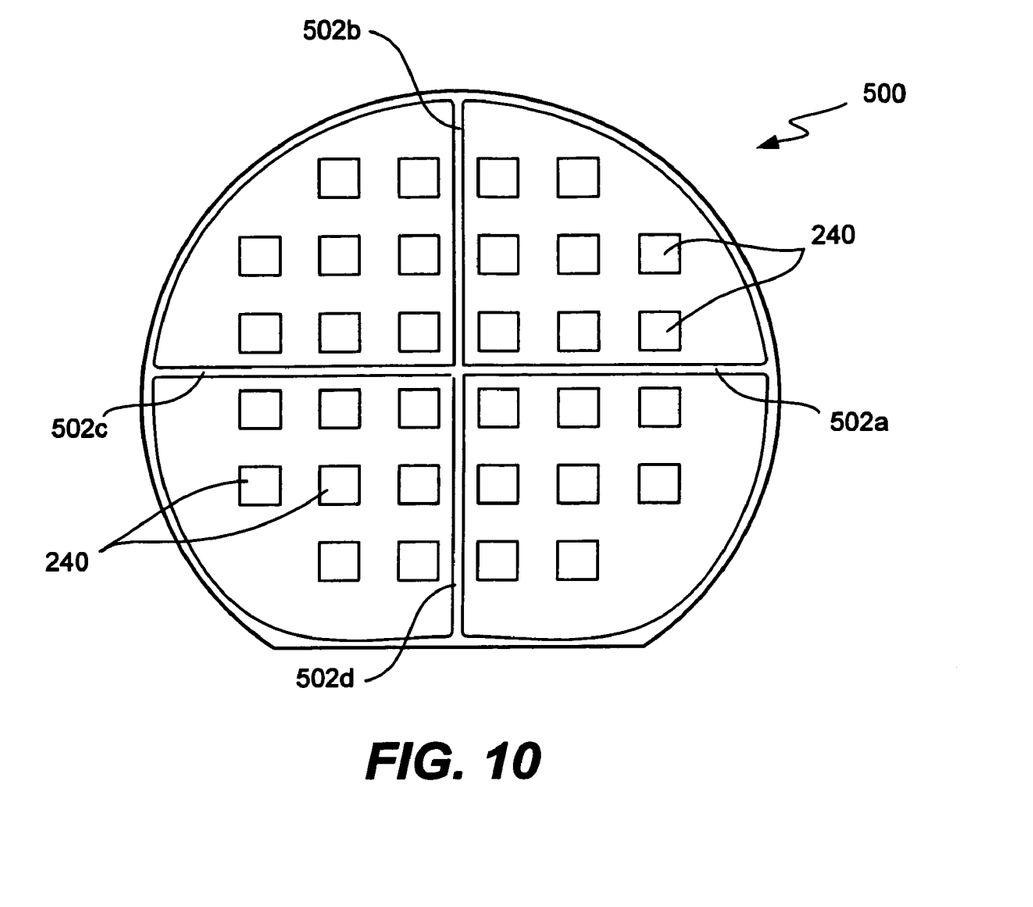
FIG. 10 is a diagrammatic bottom view of a wafer having structural support features in addition to the pedestals.

As will be appreciated by those familiar with the packaging arts, when wafers are thinned to create very thin dice (e.g. thicknesses of 3 mils or less), the wafer becomes very fragile and flexible. The flexibility and corresponding fragility can lead to a variety of handling problems. Therefore, it can be useful to provide structures that provide structural support to the thinned wafer. The described pedestal formation process can be used to form any features on the back surface of the wafer, including structural support features. For example, FIG. 10 illustrates a wafer 500 having structural support ribs 502 in addition to pedestals 240. The structural support ribs 502 are formed at the same time as the pedestals and are positioned in regions of the wafer that are unused or will be sacrificed during dicing. In the illustrated embodiment, the ribs include perpendicular cross ribs 502(a) and 502(b), as well as a peripheral rib 502(c) that extends around the periphery of the wafer. It should be appreciated that the number of ribs, as well as their geometry and placement can be widely varied. If desired, the other features may be insulated as well.

Although only a few embodiments of the invention have been described in detail, it should be appreciated that the invention may be implemented in many other forms without departing from the spirit or scope of the invention. As discussed above, the size, shape, placement and number of the pedestals can be widely varied to meet the needs of a particular situation. In the illustrated embodiments, only two die stacks are shown. However, it should be appreciated that the described dice can be used in packages that stack more than two dice. In the larger stacks, the described pedestals can be used to form spacers between any pair of dice in the stack, in each of the upper dice or in virtually any other configuration where a spacer might be needed.

Although a couple specific insulating materials have been discussed above, it should be appreciated that the insulating layer may be formed of any suitable insulating and/or dielectric material. Also, the insulating layer may be applied using any desired process. Although spin coating and spraying work well, other deposition and depositing processes including vapor deposition, screen printing, dispensing and others may be used. Therefore, the present embodiments are to be considered as illustrative and not restrictive and the invention is not to be limited to the details given herein, but may be modified within the scope and equivalents of the appended claims.

The invention claimed is:

1. An integrated circuit package comprising:
   a first die having an active surface;
   a first set of connectors that electrically connect I/O pads exposed on the active surface of the first die to a carrier; and
   a second die stacked on the first die, the second die having a pedestal and an active region, the pedestal being integrally formed with the active region and including sidewalls, the pedestal having a smaller footprint than a footprint of the second die so that portions of a bottom surface of the second die are recessed relative to a bottom surface of the pedestal, and wherein the pedestal is mounted on the active surface of the first die, the die including an electrically insulating layer that covers at least portions of the sidewalls of the pedestal, wherein the insulating layer only coats and covers portions of the second die and does not encapsulate any portions of the first set of connectors, whereby the insulating layer helps prevent connectors in the first set of connectors from electrically communicating with the pedestal.

2. An integrated circuit package as recited in claim 1 wherein the electrically insulating layer covers all of the sidewalls of the pedestal and all recessed portions of the bottom surface of the second die.

3. An integrated circuit package as recited in claim 1 wherein:
   the recessed portions of the bottom surface of the second die includes a ledge region that extends entirely around the pedestal; and
   the footprint of the second die is at least as large as a footprint of the first die and the ledge overhangs portions of all of the first set of connectors.

4. An integrated circuit package as recited in claim 1 further comprising:
   a second set of connectors that electrically connect I/O pads exposed on an active surface of the second die to the carrier; and
   an encapsulant that encapsulates the connectors and at least portions of the first and second dice.

5. An integrated circuit package as recited in claim 1 wherein the second die has a plurality of distinct pedestals that are each integrally formed with the active region.

6. An integrated circuit package as recited in claim 5 wherein a bonding wire is positioned in a gap formed between adjacent pedestals.

7. An integrated circuit package as recited in claim 1 wherein the carrier is selected from the group consisting of a lead frame and a substrate having conductive traces and contacts thereon.

8. An integrated package as recited in claim 1 wherein the pedestal constitutes more than half of the total thickness of the second die.

9. An integrated package as recited in claim 1 wherein the insulating layer is formed from a material selected from the group consisting of: polyimide; benzocyclobutene (BCB); silicon dioxide and silicon nitride.

10. An integrated package as recited in claim 1 wherein the insulating layer is formed by a process selected from the group consisting of: spin coating; spraying; screen printing and vapor deposition.

11. A semiconductor device comprising a die having an active surface, a bottom surface, an active region, a pedestal on the bottom surface and an electrical insulating layer, the pedestal being integrally formed with the active region and including sidewalls, and the electrical insulating layer being arranged to cover at least portions of the sidewalls of the pedestal, wherein the insulating layer only coats and covers portions of the die and does not encapsulate any other structures, whereby the insulated pedestal has a smaller footprint than a total footprint of the die so that portions of the bottom surface of the die are recessed relative to a bottom surface of the pedestal.

12. A semiconductor device as recited in claim 11 wherein the insulating layer further covers the recessed portions of the bottom surface of the die.

13. A semiconductor device as recited in claim 12 wherein the insulating layer further covers the bottom surface of the pedestal.

14. An integrated circuit package as recited in claim 11 wherein the die has a plurality of distinct pedestals that are each integrally formed with the active region.

15. An integrated circuit package as recited in claim 14 wherein the pedestals are arranged in one from the group consisting of:
   a two dimensional array of posts; and
   an array of substantially parallel elongated pedestals.

16. An integrated circuit package as recited in claim 11 wherein the pedestal has a footprint that is selected from the group consisting of: substantial rectangular with rounded corners, substantially oval and substantially circular.

17. An integrated package as recited in claim 11 wherein the pedestals constitute more than half of the total thickness of the second die.

18. An integrated package as recited in claim 11 wherein the insulating layer is formed from a material selected from the group consisting of: polyimide; benzocyclobutene (BCB); silicon dioxide and silicon nitride.

19. An integrated package as recited in claim 11 wherein the insulating layer is formed by a process selected from the group consisting of: spin coating; spraying; screen printing and vapor deposition.

20. An integrated circuit wafer comprising a multiplicity of dice as:
   each die having an active surface, a bottom surface, an active region and a pedestal on the bottom surface, the pedestal being integrally formed with the active region and including sidewalls; and
   an electrically insulating layer that covers at least portions of the sidewalls of the pedestal, whereby the insulated pedestal has a smaller footprint than a total footprint of the die so that portions of the bottom surface of the die are recessed relative to a bottom surface of the pedestal.

21. A wafer as recited in claim 20 wherein the insulating layer is formed from a material selected from the group consisting of: polyimide; benzocyclobutene (BCB); silicon dioxide and silicon nitride.

22. An integrated package as recited in claim 20 wherein the insulating layer is formed by a process selected from the group consisting of: spin coating; spraying; screen printing; vapor deposition and dispensing.

* * * * *